(12) United States Patent
Ingle

(10) Patent No.: US 8,907,354 B2
(45) Date of Patent: Dec. 9, 2014

(54) OPTOELECTRONIC DEVICE HAVING AN ELASTIC ELECTRODE

(75) Inventor: Andrew Ingle, Allershausen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/808,947

(22) PCT Filed: Jul. 8, 2010

(86) PCT No.: PCT/EP2010/059799
§ 371 (c)(1),
(2), (4) Date: Jan. 8, 2013

(87) PCT Pub. No.: WO2012/003872
PCT Pub. Date: Jan. 12, 2012

(65) Prior Publication Data
US 2013/0112963 A1    May 9, 2013

(51) Int. Cl.
| | | |
|---|---|---|
| H01L 33/00 | (2010.01) |
| H01L 27/15 | (2006.01) |
| H01L 23/28 | (2006.01) |
| H01L 51/52 | (2006.01) |
| H01L 51/00 | (2006.01) |
| H01L 27/32 | (2006.01) |

(52) U.S. Cl.
CPC .......... *H01L 51/5203* (2013.01); *H01L 51/524* (2013.01); *H01L 27/3204* (2013.01); *H01L 51/0021* (2013.01); *H01L 27/3202* (2013.01)
USPC ........ 257/81; 257/40; 257/746; 257/E23.067; 257/E21.511; 257/E21.499; 438/22; 438/667; 438/127; 174/521; 174/262; 174/267; 174/89

(58) Field of Classification Search
CPC .......... H01L 31/00; H01L 27/00; H01L 33/00; H01L 51/00; H01L 51/5203; H01L 51/0021; H01L 51/524; H01L 51/52; H01L 51/42; H01L 51/44; H01L 51/50; H01L 51/54; H01L 27/3202; H01L 27/3204; H01L 27/32; H01L 27/15; H05B 33/04; H05B 33/10; H05B 33/26; H05B 33/06; H05B 33/02; H05B 33/00
USPC ........ 257/40, 734, 81, 99, 418, 746, E21.499, 257/E23.067, E23.068, E23.078, E23.01, 257/E21.511, 690; 428/667, 675, 678, 614, 428/666, 17, 598, 127, 22, 455, 456, 458, 428/459; 174/521, 262, 267, 89
See application file for complete search history.

(56) References Cited

U.S. PATENT DOCUMENTS

| | | | |
|---|---|---|---|
| 2001/0049207 A1* | 12/2001 | Sakata et al. | 439/66 |
| 2005/0224762 A1* | 10/2005 | Hasegawa | 252/500 |
| 2007/0145887 A1* | 6/2007 | Chae et al. | 313/504 |
| 2009/0302760 A1 | 12/2009 | Tchakarov et al. | |

FOREIGN PATENT DOCUMENTS

| | | |
|---|---|---|
| EP | 1 837 884 | 3/2006 |
| JP | 57-211280 | 12/1982 |
| JP | 2001-235492 | 8/2001 |
| JP | 2004-031295 | 1/2004 |

(Continued)

*Primary Examiner* — Wensing Kuo
*Assistant Examiner* — Moazzam Hossain
(74) *Attorney, Agent, or Firm* — Cozen O'Connor

(57) ABSTRACT

The present disclosure relates to an optoelectronic device, in particular to an arrangement for contacting an optoelectronic device. The optoelectronic device (200) includes an elastic electrode (208). A method for forming the elastic electrode (208) is described.

9 Claims, 6 Drawing Sheets

(56) References Cited

FOREIGN PATENT DOCUMENTS

| | | |
|---|---|---|
| JP | 2004-103337 | 4/2004 |
| JP | 2004-247256 | 9/2004 |
| JP | 2007-173200 | 7/2007 |
| JP | 2007-329313 | 12/2007 |
| JP | 2009-088515 | 4/2009 |

* cited by examiner

OPTOELECTRONIC DEVICE HAVING AN ELASTIC ELECTRODE

RELATED APPLICATIONS

This is a U.S. National Phase Application under 35 USC 371 of International Application PCT/EP2010/059799 filed on Jul. 8, 2011.

FIELD OF THE INVENTION

The present disclosure relates to an optoelectronic device, in particular to an arrangement for contacting an optoelectronic device.

BACKGROUND OF THE INVENTION

An optoelectronic device is arranged for converting electric energy into electromagnetic radiation, such as visible light, or vice versa. One example of an optoelectronic device is a Light Emitting Device, such as a Light Emitting Diode (LED). Light emitting devices are used to emit light by an optical surface, i.e. a light emitting surface. They typically include electrodes contacting an active area that transforms an electric current into optical energy. The electrodes connect to external contacts allowing for connecting the Light Emitting Device to an external energy source, such as a battery.

A particular example of a large-area light source is an organic light emitting device (OLED). An OLED comprises an active area including organic material to emit electromagnetic radiation. The active area is typically arranged between an anode and a cathode as electronic contacts. If a voltage is applied to the contacts, charge carriers are injected into the active area. Under the influence of the voltage drop, positive charge carriers, i.e. hole excitations (holes) injected by the anode migrate through the active area towards the cathode. Electrons injected by the cathode migrate under the influence of the voltage drop through the active area towards the anode. Within in the active area holes and electrons might eventually recombine to excitons and relax under emission of electromagnetic radiation, such as visible light.

Other examples of optoelectronic devices detect optical signals through electronic processes. These devices may be arranged as photo detectors or energy sources for converting electromagnetic radiation into electric energy, such as solar cells. They include a larger optical surface to receive and to guide optical energy to an active area.

Both types of devices are used in large-area application. Within a large-area application, it is desirous to provide for electrodes that do not cover or shade the optical surface. Furthermore, it is desirous to provide for electrodes that are easily contacted, either to an external power source or to another electronic device, such as another optoelectronic device.

SUMMARY

Various embodiments of an optoelectronic device according to the present disclosure have a support and a conducting layer arranged on the support. An active layer connects to the conducting layer. An encapsulation capping, which covers the active layer attaches to the support. A layer gap is formed between the support and the encapsulation capping. An elastic electrode is arranged in the layer gap and contacts the conducting layer.

Theses embodiments of the optoelectronic device provide for a lateral elastic electrode of the optoelectronic device. This allows an easy connection of the optoelectronic device to an electric terminal. By way of example, the optoelectronic device may be laid as a tile. This is particularly advantageous in the context of an optoelectronic panel, such as an organic light emitting device, a beam waveguide module including optoelectronic elements, or a solar cell. Since the electrical contacts are arranged at the side walls, a large optical active surface may be kept free of contacting elements. Furthermore, the provision of an elastic electrode allows for small contact regions between neighbouring cells.

In various embodiments of the optoelectronic device, the elastic electrode comprises an elastomer. Yet, in other embodiments, the elastic electrode may comprise an elastic element, such as a spring.

In various embodiments of the optoelectronic device, the elastic electrode comprises conductive particles dispersed in an elastic matrix material. The dispersion of conductive particle, such as particles including a metal or carbon, enhances the electric conductivity of the elastic electrode.

In various embodiments of the optoelectronic device, the elastic electrode comprises an conductive elastomer.

In various embodiments of the optoelectronic device, the active area comprises an organic luminescent material. Organic luminescent materials allow for arranging for a large area light emitting surface. The optoelectronic device may thus be arranged as large lighting tile. In some embodiments, the light emitting surface is defined by the support and/or the encapsulation capping.

In various embodiments of the optoelectronic device, the support is being formed as a rigid support. The may be achieved by using diverse rigid materials, such as glass, ceramics, etc. In other embodiments, the support may comprise flexible materials, such as a plastic.

In various embodiments of the optoelectronic device, the encapsulation capping is attached by an attaching member to the support. Thus, the active area may be completely sealed by the encapsulation capping, the attachment member and the support. Furthermore, the attachment member allows for a defined spacing between encapsulation capping and support, thus defining the size of the layer gap's vertical extension. In some embodiments, the attaching member may comprise at least one of the following: a glue; a solder ball, or a glass frit.

Various embodiments of a method of forming an electrode of an electronic panel device comprise the steps of:
provide an electronic panel device having a conductive layer and a layer gap, the conductive layer reaching into the layer gap;
applying an conductive elastomer in a liquid phase on the layer gap;
curing the conductive elastomer.

In various embodiments, the method comprises the step of allowing the conductive elastomer to flow into the layer gap to cover a part of the conductive layer before curing the conductive elastomer.

In various embodiments, the method comprises the step of providing the layer gap such that the conductive elastomer is pulled into the layer gap by capillary forces.

In various embodiments of the method, the step of curing the conductive elastomer comprises at least one of the following: applying IR radiation; heating; applying a current to the conductive elastomer; or applying a cross-linking agent to the conductive elastomer. Alternatively, the elastomer may also cure or dry at room temperature.

In various embodiments of the method, the step of applying the conductive elastomer comprises at least one of the following: brushing the conductive elastomer on the layer gap;

or dipping the layer gap in a an bath of liquid conductive elastomer; or injecting the conductive elastomer.

In various embodiments, the method comprises the step of pressing the conductive elastomer into the layer gap.

BRIEF DESCRIPTION OF THE DRAWINGS

The detailed description is described with reference to the accompanying figures. In the figures, the left most digit(s) of a reference sign identify the figure in which the reference sign first appears. The use of the same reference sign in different instances in the description and the figures may indicate similar or identical items. While all embodiments described refer to a light emitting device, in particular to an organic light emitting device, it is readily understood, that the present disclosure may also be applied in the context of other embodiments of optoelectronic devices, such as photo detectors or solar cells.

DETAILED DESCRIPTION

Contact Ledge Embodiment

Figure 1:
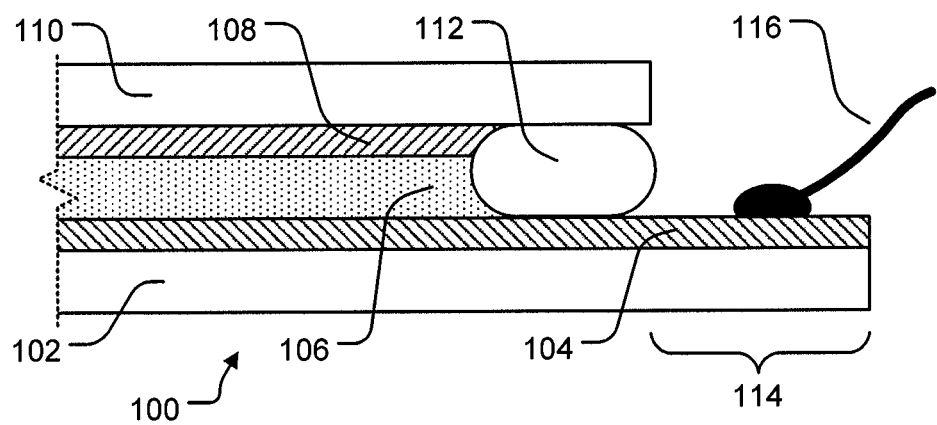
FIG. 1 shows an exemplary illustration of a contact ledge electrode embodiment.

FIG. 1 shows an exemplary illustration of a contact ledge electrode embodiment of an optoelectronic device 100. It shows a partial view of the optoelectronic device 100 at a contact ledge. The optoelectronic device 100 has a support 102. The support 102 may be a rigid support, e.g. a glass panel, a ceramic tile, a semiconductor wafer, such as a silicon wafer, or a metal support, such as a lead frame. In various other embodiments, the support 102 may be a flexible support, such as a plastic sheet, a synthetic film, or a thinned semiconductor wafer. In any embodiment, the basic function of the support 102 lies in giving a mechanical stabilization to the optoelectronic device 100. The support 102 is covered by a first conductive layer 104. The first conductive layer 104 contacts an active layer 106 provided on top of the conductive layer 104. To provide a reliable electronic contact, the first conductive layer 104 comprises a material having a low sheet resistance. Furthermore, the first conductive layer 104 is selected for providing a reliable adhesion on the support 102.

This requires a coefficient of thermal expansion of the first conductive layer 104 to be close to a coefficient of thermal expansion of the support 102. Thus, an unwanted delamination of the first conductive layer 104 may be avoided. The material forming the first conductive layer 104 may be chosen from at least one of the following group:

a intransparent or transparent conductive polymer, such as poly-(3,4 ethylenedioxythiophene) (PEDOT) or carbon nano tubes;

a metal or metal alloy comprising a metal such as aluminium (Al), silver (Au), copper (Cu), gold (Ag), chrome (Cr), etc.;

a transparent metal alloy, such a metal oxide, e.g. an Indium-Tin Oxide (ITO), Fluroine doped Tin Oxide (SnFOx), Indium Zinc Oxide (IZO), Zinc Oxide (ZnO), etc.;

a doped semiconductor material, such as a n-doped or a p-doped material.

The active layer 106 is arranged on a portion of the first conductive layer 104. It is covered be a second conductive layer 108. The second conductive layer 108 may be formed from the same materials described with reference to the first conductive layer 106. In one embodiment, the first conductive layer 104 serves as anode, e.g. allowing for injecting holes into the active layer 106. The second conductive layer 108 serves as cathode, e.g. allowing for injecting electrons into the active layer 106. The active area 106 typically comprises a multilayer structure, e.g. having layers to enhance hole injection by lowering electronic barriers. It may further comprise one or plural layers to control an electron-hole recombination within an emissive area. In many embodiments, the active layer 106 comprises organic materials, such as small molecules or polymers, to enable charge transport or to enhance charge recombination.

The second conductive layer 108 is covered by an encapsulation capping 110 attached to the first conductive layer by an attachment member 112. The encapsulation capping 110, the first and second conductive layers 104 and 108, as well as the attachment member 112 form a cavity for holding the active layer 106 and providing a sealed encapsulation to the same.

The encapsulation capping 110 may be chosen from the same materials as the support 102. It may as well be flexible or rigid. In many embodiments, the encapsulation capping 110 and/or the support 102 are transparent in the spectral domain of radiation emitted through the active area 106. The attachment member 112 may be a flexible material, such as glue, e.g. an epoxy resin. In some embodiment, the attachment member may be of the same material as the support 102 or the encapsulation capping 110, e.g. by using a glass frit.

The encapsulation capping 110 is attached via the attachment member 112 to the first conductive layer 104 such that a contact ledge 114 is provided. The contact ledge 114 is formed by portion of the support 102 which protrudes from the attachment member 112 and which is covered by the first conductive layer 104. The contact ledge 114 provides for an contact point accessible outside the encapsulation of the optoelectronic device 100. Typically, it has a horizontal extension of 2.5 mm or more. The contact ledge 114 may either be brought into contact with an electrode or contacted to an energy source be means by a contact bond 116, as indicated in FIG. 1.

Lateral Electrode Embodiment

Diverse lateral electrodes embodiments will be described with reference to the following figures. With reference to FIG.

2a, FIG. 2b, and FIG. 2c, a first embodiment will be described by referring to a method of forming an electrode of an optoelectronic device 200.

Figure 2A:
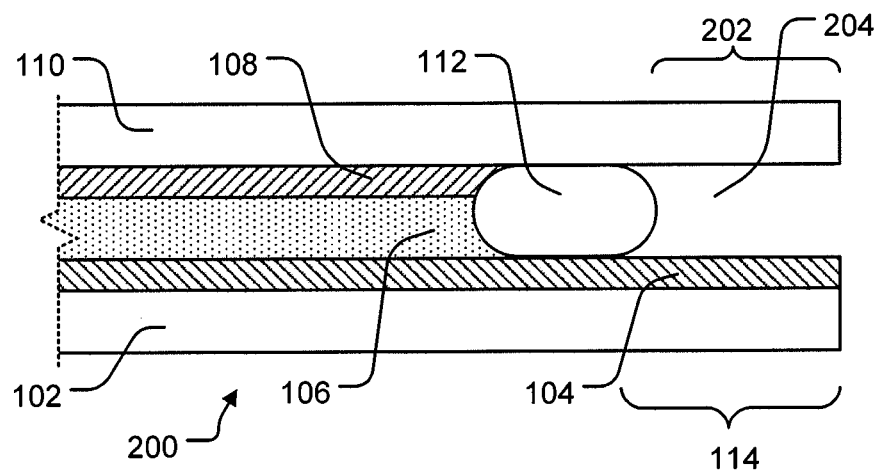
FIG. 2a shows an exemplary illustration of a pre-product of a first electrode embodiment.

FIG. 2a shows an exemplary illustration of a pre-product of the first electrode embodiment. The pre-product is the optoelectronic device 200, having a support 102, a first conductive layer 104, an active layer 106, a second conductive layer 108, and an encapsulation capping 110. The encapsulation capping 110 attaches to the support 102 by means of an attachment member 112. The described elements of the optoelectronic device 200 may be chosen from the same materials and/or dimensions as in the optoelectronic device 100 of the contact ledge embodiment described with reference to FIG. 1. It is a particular distinction between the first electrode embodiment and the contact ledge embodiment that the encapsulation capping 110 has a protrusion 202, which projects over the attachment member 110. In consequence, a gap 204 between the protrusion 202 and the contact ledge 114 is formed. The gap has a lateral opening opposite to the attachment member 112. Thus, an optoelectronic device 200, i.e. the pre-product of the first electrode embodiment, is provided, which includes the first conductive layer 104 and a layer gap 204, the first conductive layer 104 reaching into the layer gap 204.

Typically, the gap 202 is quite narrow. Its depth is defined by the extension of the protrusion 202 and the contact ledge 114 reaching over the attachment member. That extension is preferably about 0.8 mm or even smaller. The separation distance between the protrusion 202 and the contact ledge 114 strongly depend on the heights of the attachment member 112 and might be about 10 μm or smaller.

Figure 2B:
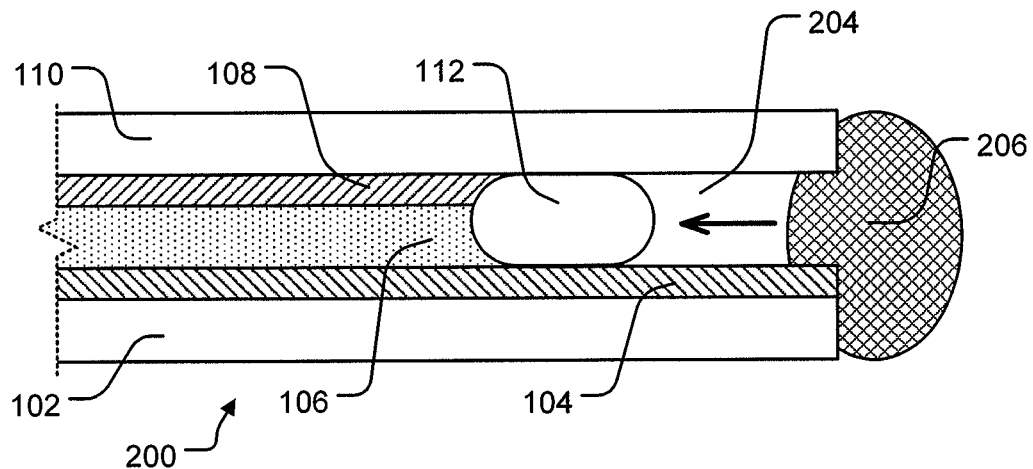
FIG. 2b shows an exemplary illustration of an intermediate product of the first electrode embodiment.
Figure 2C:
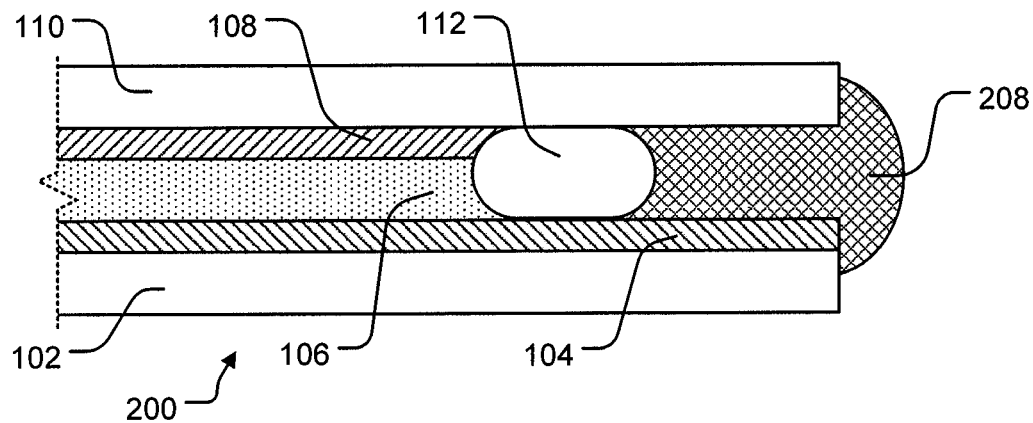
FIG. 2c shows an exemplary illustration of the first electrode embodiment.

FIG. 2b shows an exemplary illustration of a intermediate product of the first electrode embodiment. The intermediate product shown in FIG. 2b differs from the pre-product of FIG. 2a in that an elastomeric paste 206, i.e. an elastomeric material in liquid phase, is applied on an opening of the gap 204. The term "liquid state" may as well be understood as a viscoelastic state of the elastomeric paste 206. The application may be performed by brushing the elastomeric paste 206 onto the opening of the gap 204 or by dipping the gap 204 into the elastomeric paste 206.

The elastomeric paste 206 comprises a conductive material, such as conductive particles loaded into an elastomer and/or conductive elastomers. E.g. small metallic particles, such as particles including Al, Au, Cu, or Ag, may be provided as conductive particles. In addition or as alternative, small conductive organic particles, such as fullerenes or carbon nanotubes (CNT) may be provided as conductive particles. Conductive elastomers, in particular conductive elastomers loaded with conductive particles, are known to the person skilled in the art, e.g. as described in document [1].

Once the elastomeric paste 206 is provided at the gap 204, it is pulled into gap 204 by capillary forces. Due to the small separation distance of the gap 204, capillary forces are strong enough to draw the elastomeric paste 206 in. The strength of the capillary forces depends on the surface tension of the elastomeric paste 206. A low surface tension will allow for an efficient entrance of the elastomeric paste into the gap opening. To lower the surface tension, a solvent within the elastomeric paste 206 may be used. The capillary forces furthermore depend on a interfacial surface tension between the first conductive layer 104 and the elastomeric paste 206. The higher the interfacial surface tension the better a wetting of the first conductive layer 104 by the elastomeric paste 206 might be achieved. This is particularly advantageous, since a reliable and large coverage of the elastomeric paste 206 on the first conductive layer 104 will provide for a reliable electrical contact between these two layers.

To enhance the filling, the elastomeric paste 206 may be pushed into the gap 204, e.g. by applying pressure using a mould (compression moulding). Such a moulding may also serve to form the elastomeric paste outside the gap 204, covering sidewalls of the first conductive layer 104 and at least partly of the encapsulation capping 110 and/or the support 102. Furthermore, a wetting agent may be comprised in the elastomeric paste 206 to enhance the coverage of the first conductive layer 104 by the elastomeric paste 206.

After having achieved a sufficient wetting of the first conductive layer 104 by the elastomeric paste 206, the elastomeric paste 206 is cured. The curing produces a transition from liquid phase into an amorphous state. It may include the steps of forming larger polymers from monomers or smaller polymers, induced by IR radiation or a polymerization agent. It may as well include the production of entanglements of larger polymer chains by vaporescence of a solvent or the cross-linking of polymers induced by IR-Radiation or a cross-linking agent. The curing results in producing a soft elastomeric solid matter.

As results, am elastic electrode 208 is provided in the gap 204. FIG. 2c shows an exemplary illustration of the first electrode embodiment having the elastic electrode 208. Since the gap 204 had been completely filled by capillary forces with elastomeric paste 206, it is now completely filled by parts of the elastic electrode 208. The elastic electrode 208 protrudes from the gap, covering sidewalls of the first conductive layer 102, and at least partly covering the sidewalls of the support 102 and the encapsulation capping 110. To enhance the adhesion of the elastic electrode 208 within the gap 204, inner walls of the gap, i.e. portions of those surfaces of the encapsulation capping 110, the first conductive layer 104, or the attachment member 112 may have groove-like depressions, small recesses or other suitable attaching means. It might as well be possible to provide for intermediate adhesion layers, such as glues, before providing the elastic electrode 208 into the gap.

The portion of the elastic electrode 208 which protrudes outside serves as external electric connection, e.g. by closely connecting to an external electrode, such as an electrode of a current source, a load, or alike. This portion may have been formed by a mould before curing the elastomeric paste or by shaping after the curing process. It should be big enough to allow for an elastic deformation of the same and for a reliable electric contact to the external electrode.

A dense filling of the gap 204 with the elastic electrode 208 has many different advantages. Depending on a gas permeability of the elastomer, it may ensure a hermetically, airtight sealing to the gap 204, such relaxing requirements on the sealing properties of the attachment member 112. Furthermore, it ensures a reliable electric contact to the first conductive layer 104. In addition, it ensures a strong grip of the elastic electrode 208 in the gap 204.

Figure 3A:
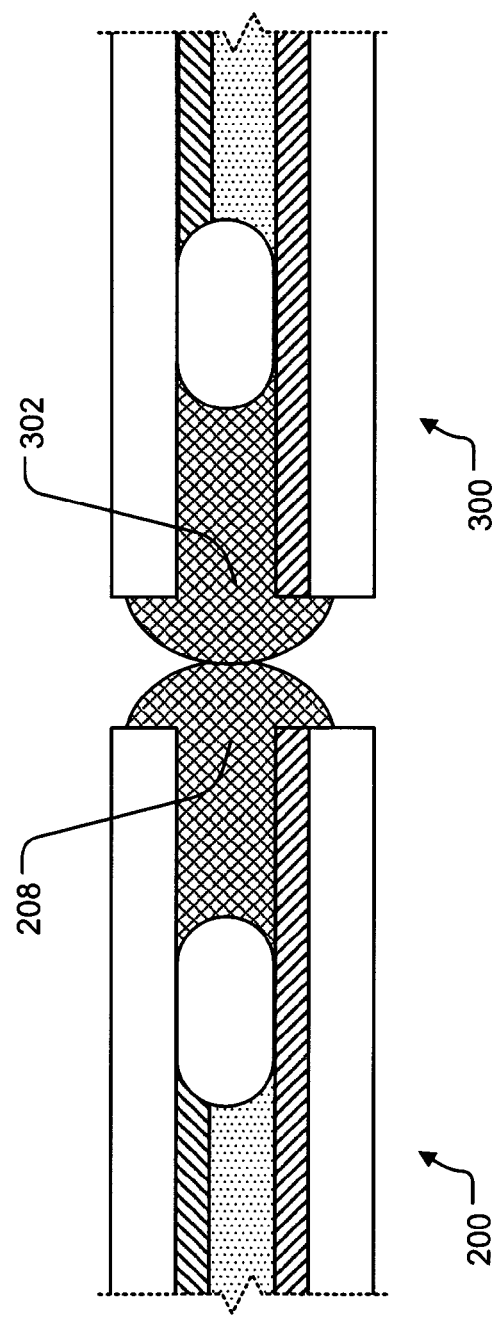
FIG. 3a shows an exemplary illustration of a side view on a first optoelectronic device system comprising a first electrode embodiment.
Figure 3B:
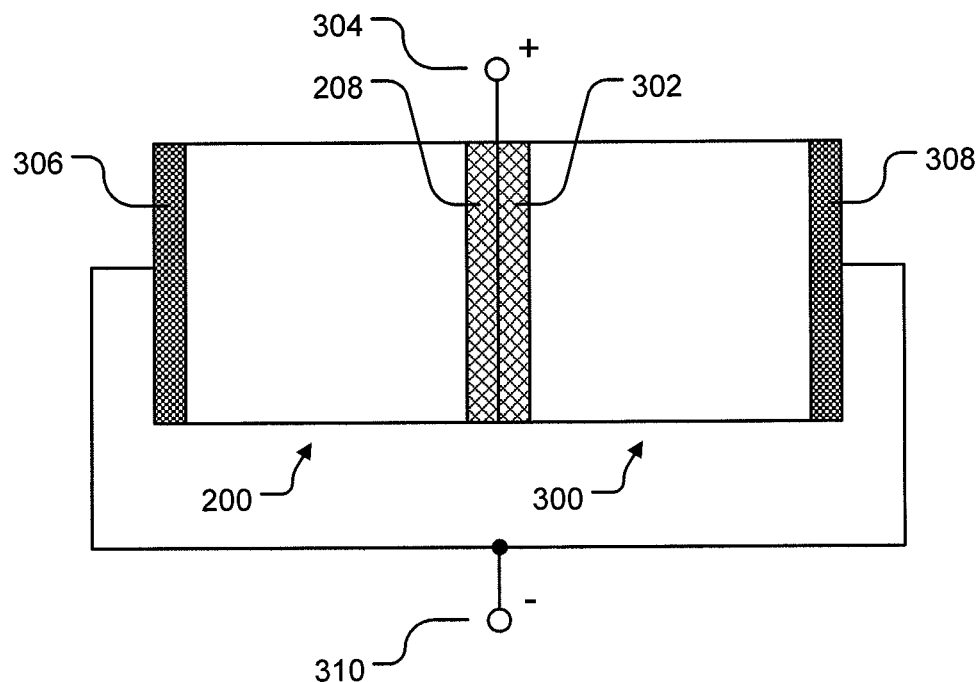
FIG. 3b shows an exemplary illustration of a top view on the first optoelectronic device system comprising the first electrode embodiment.
Figure 3C:
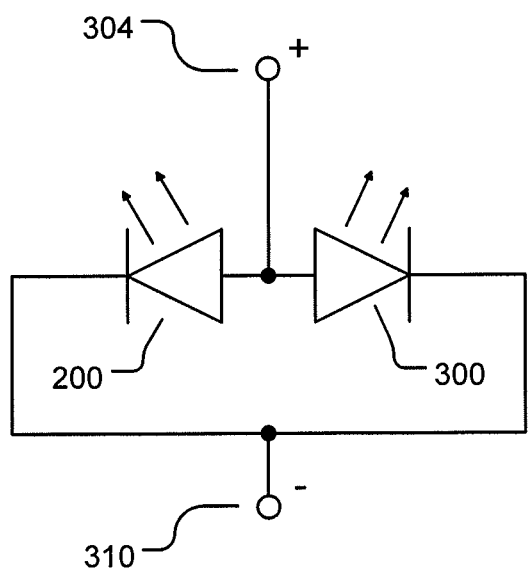
FIG. 3c shows an equivalent circuit diagram of the first optoelectronic device system.

With reference to FIG. 3a, FIG. 3b, and FIG. 3c, a first optoelectronic device system using the optoelectronic device 200 will be described. By way of example, the optoelectronic device 200 is arranged as light emitting device, in particular as organic light emitting device, thus providing for a large light emitting area, i.e. a light emitting panel.

FIG. 3a shows an exemplary illustration of a side view on a first optoelectronic device system comprising a first electrode embodiment. The first optoelectronic device system includes an optoelectronic device 200 and a second optoelectronic device 300. The optoelectronic device 200 has an elastic electrode 208 provided laterally on the right side of the optoelectronic device 200. The second optoelectronic device 300 has a second elastic electrode 302 provided laterally on the left side of the second optoelectronic device 300. By bringing the elastic electrode 208 into physical contact with the second elastic electrode 302, an electrical connection between the optoelectronic device 200 and the second optoelectronic device 300 is established. Providing a vertical action to push the optoelectronic device 200 onto the second optoelectronic device 300 will deform the elastic electrode 208 and the second elastic electrode 302, thus creating a large interfacial area between the two. The larger the interfacial area, the larger and more reliable the two electrodes will contact each other.

FIG. 3b shows an exemplary illustration of a top view on the first optoelectronic device system comprising the first electrode embodiment. In the first optoelectronic device system, the elastic electrode 208 of the optoelectronic device 200 contacts the second elastic electrode 302 of the second optoelectronic device 300. The electrodes contact to a first voltage terminal 304. The connection might be provided by a metal electrode arranged between or on the elastic electrode 208 and/or the second elastic electrode 302.

The optoelectronic device 200 further has a third elastic electrodes 306 arranged at a sidewall opposite to the elastic electrode 208. The third elastic electrode 306 is a contact to the second conductive layer 108 of the optoelectronic device 200. The second optoelectronic device 300 has a fourth elastic electrode 308 arranged at a sidewall opposite to the second elastic electrode 302. The third elastic electrode 306 and the fourth elastic electrode 308 connect to a second voltage terminal 310. By way of example, a positive voltage is applied to the first voltage terminal 304, while a negative voltage is applied to the second voltage terminal 310.

FIG. 3c shows an equivalent circuit diagram of the first optoelectronic device system as depicted in FIG. 3b. The optoelectronic device 200 as well as the second optoelectronic device 300 correspond each to a light emitting diode (LED). The anodes of both LEDs connect to the first voltage terminal 304. The cathodes of both LEDs connect to the second voltage terminal 310. The equivalent circuit corresponds to a parallel circuit of two LEDs in conducting direction, i.e. in forward bias.

In view of FIG. 3b and FIG. 3c, is to be appreciated, that providing an electrical contacting to the optoelectronic device 200 may easily be achieved by clamping the optoelectronic device sidewise at its elastic electrode between two elongated contact members or bringing it in tight connection to an electronic device having an elongated electrode. Since the optoelectronic device 200 itself has an elastic electrode 208, it may provide easily and solidly for a good and constant electric interfacing. Thus, the optoelectronic device may easily be inserted into or taken out of a contact bank.

Figure 4A:
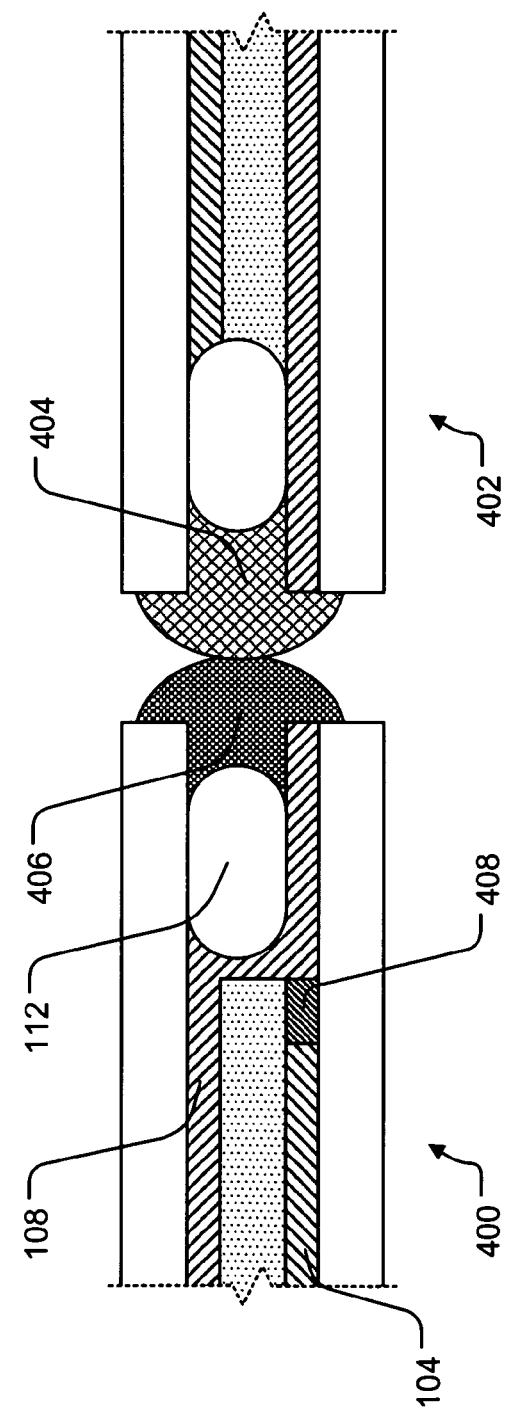
FIG. 4a shows an exemplary illustration of a side view on a second optoelectronic device system comprising a second electrode embodiment.
Figure 4B:
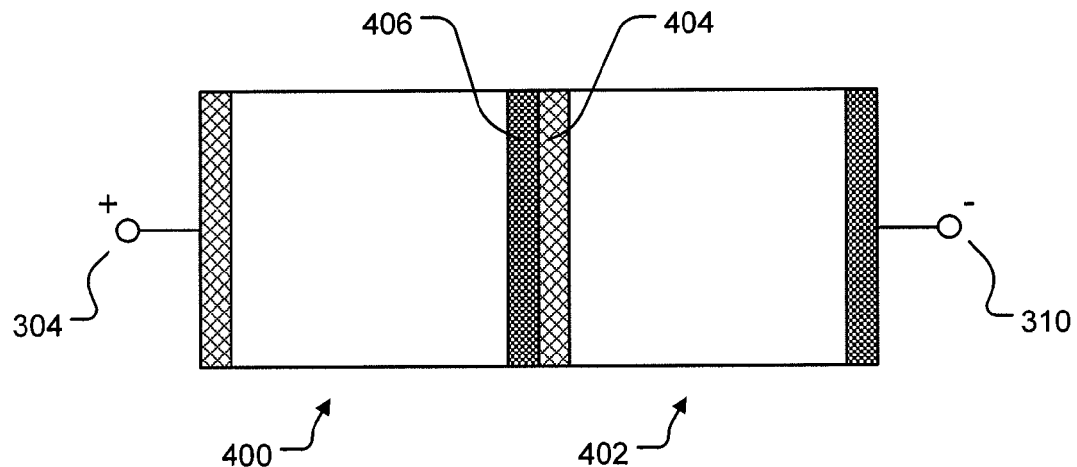
FIG. 4b shows an exemplary illustration of a top view on the second optoelectronic device system comprising the second electrode embodiment.
Figure 4C:
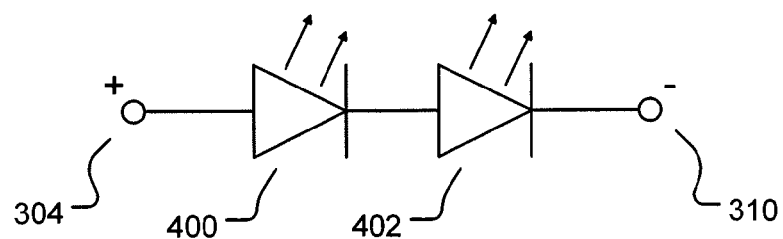
FIG. 4c shows an equivalent circuit diagram of the second optoelectronic device system.

FIG. 4a, FIG. 4b, and FIG. 4c show a second optoelectronic device system comprising a second electrode embodiment. As in the description of the first optoelectronic device system, an optoelectronic device 300 is arranged as light emitting device, in particular as organic light emitting device, thus providing for a large light emitting area, i.e. a light emitting panel. This restriction to a light emitting device is done by way of example, so to allow for a clear and simple description. It is understood, that the disclosure may be applied in the context of any other suitable optoelectronic device.

FIG. 4a shows an exemplary illustration of a side view on the second optoelectronic device system comprising the second electrode embodiment. The second optoelectronic device system has a first optoelectronic device 400 and a second optoelectronic device 402. The second optoelectronic device 402 has a first elastic electrode 404 according to the first electrode embodiment, as described with reference to FIG. 2a to FIG. 3c. In contrast, the second optoelectronic device 402 has a second elastic electrode 406 according to the second electrode embodiment. The second electrode embodiment differs from the first electrode embodiment, that the second elastic electrode 406 contacts a second conductive layer 108 of the first optoelectronic device 400 and not a first conductive layer 104 as arranged for in the first electrode embodiment. Accordingly, the second conductive layer spreads at the attachment member 112 downwards to the support, and extends on the contact ledge of the support 102. The first conductive layer 104 and the second conductive layer are electrically insulated by a insulating layer 408, arranged between both conductive layers.

FIG. 4b shows an exemplary illustration of a top view on the second optoelectronic device system comprising the second electrode embodiment. In the second optoelectronic device system, the first elastic electrode 404 of the second optoelectronic device 402 contacts the second elastic electrode 406 of the first optoelectronic device 400. The connection might provide by mechanical pressure between the electrodes or by arranging an elongated metal electrode between these.

The optoelectronic device 400 further has a third elastic, which connects to a first voltage terminal 304. The second optoelectronic device 300 has a fourth elastic electrode 308 which connect to a second voltage terminal 310. By way of example, a positive voltage is applied to the first voltage terminal 304, while a negative voltage is applied to the second voltage terminal 310.

FIG. 4c shows an equivalent circuit diagram of the second optoelectronic device system as depicted in FIG. 4b. The first optoelectronic device 400 as well as the second optoelectronic device 402 correspond each to a light emitting diode (LED). The anode of the first optoelectronic device 400 contacts the first voltage terminal 304. The cathode of the first optoelectronic device contacts the anode of the second optoelectronic device 402, while the cathode of the second optoelectronic device 402 contacts the second voltage terminal 310. The equivalent circuit corresponds to a serial circuit of two LEDs in conducting direction, i.e. in forward bias.

Figure 5:
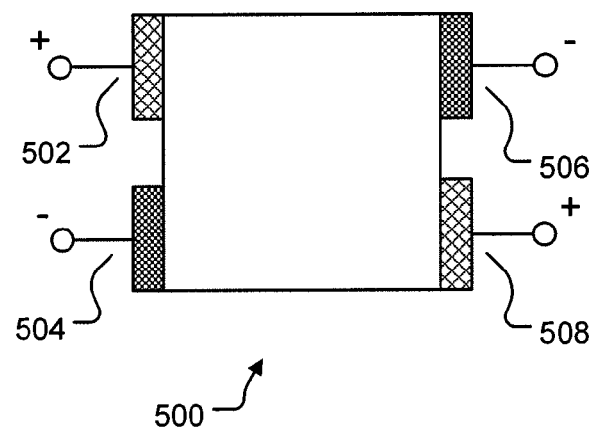
FIG. 5 shows a top view on an optoelectronic device comprising a third electrode embodiment.

FIG. 5 shows a top view on an optoelectronic device 500 comprising a third electrode embodiment. The optoelectronic device 500 has a first elastic electrode 502 of one polarity and a second elastic electrode 504 of the opposite polarity on one sidewall of the optoelectronic device. By way of example, the first elastic electrode 502 is an anode, while the second elastic electrode 504 is a cathode. On the opposite sidewall, the optoelectronic device 500 has a third elastic electrode 506 and a fourth elastic electrode 508, each of the third elastic electrode 506 and the fourth elastic electrode 508 facing one of the first elastic electrode 502 and the second elastic electrode, in particular an electrode having the opposite polarity. The third electrode embodiments thus relates to an optoelectronic device 500 having electrodes of different polarity or function on one sidewall. It illustrates only one example for diverse possibilities of providing for different configurations of an elastic electrodes at a sidewall. In other embodiments not shown in the figures, the elastic electrode may be provided in addition to a rigid electrode or a contact ledge. Furthermore, the elastic electrode may be provided at a curved sidewall of an optoelectronic device, or the elastic electrode may be comprised of elastic elements, such as a spring.

CONCLUSION

For the purpose of this disclosure and the claims that follow, the term "connect" has been used to describe how various elements interface or couple. Such described interfacing or coupling of various elements may be either direct or indirect. Although the subject matter has been described in language specific to structured features and/or methodological acts, it is understood that the subject matter defined in the appended claims is not necessarily limited to the specific features or acts described. Rather, the specific features and acts are disclosed as preferred forms of implementing the claims.

What is claimed is:

1. An optoelectronic device comprising:
    a support;
    a conducting layer arranged on the support;
    an active layer connected to the conducting layer;
    an encapsulation capping, covering the active layer and attached to the support by an attaching member, wherein the encapsulation capping has a protrusion which projects over the attaching member;
    a layer gap formed between the support and the protrusion of the encapsulation capping, wherein the layer gap has a lateral opening opposite to the attachment member and wherein the conducting layer extends into the layer gap; and
    an elastic electrode comprising an elastomer, wherein the elastic electrode is arranged in the layer gap between the support and the protrusion of the encapsulation capping and contacting the conducting layer,
    whereby the portion of the elastic electrode which protrudes outside from the gap serves as external electric connection.

2. The optoelectronic device of claim 1, the elastic electrode comprising conductive particles dispersed in an elastic matrix material.

3. The optoelectronic device of claim 1, the elastic electrode comprising an conductive elastomer.

4. The optoelectronic device of claim 1, the active area comprising an organic luminescent material.

5. The optoelectronic device of claim 1, comprising a light emitting surface defined by the support and/or the encapsulation capping.

6. The optoelectronic device of claim 1, the support being formed as a rigid support.

7. The optoelectronic device of claim 1, the attaching member comprising at least one of the following:
    a glue;
    a solder ball or
    a glass frit.

8. The optoelectronic device of claim 1, wherein the lateral extension of the layer gap is about 0.8 mm or smaller.

9. The optoelectronic device of claim 1, further comprising groove-like depressions or small recesses arranged within inner walls of the layer gap.

* * * * *